United States Patent
Sarigiannis et al.

(10) Patent No.: US 7,247,561 B2
(45) Date of Patent: Jul. 24, 2007

(54) METHOD OF REMOVING RESIDUAL CONTAMINANTS FROM AN ENVIRONMENT

(75) Inventors: Demetrius Sarigiannis, Boise, ID (US); Cem Basceri, Boise, ID (US); Christopher W. Hill, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 10/734,525

(22) Filed: Dec. 11, 2003

(65) Prior Publication Data

US 2005/0126585 A1 Jun. 16, 2005

(51) Int. Cl.
*H01L 21/44* (2006.01)
(52) U.S. Cl. .................. 438/653; 438/476; 438/685
(58) Field of Classification Search ............... 438/653, 438/476, 685
See application file for complete search history.

(56) References Cited

U.S. PATENT DOCUMENTS

| | | | | |
|---|---|---|---|---|
| 4,670,571 | A * | 6/1987 | Malpass et al. | 556/129 |
| 5,622,565 | A * | 4/1997 | Ye et al. | 118/723 R |
| 5,756,400 | A * | 5/1998 | Ye et al. | 438/710 |
| 5,788,778 | A | 8/1998 | Shang et al. | |
| 6,255,222 | B1 * | 7/2001 | Xia et al. | 438/710 |
| 6,267,122 | B1 | 7/2001 | Guldi et al. | |
| 6,290,779 | B1 | 9/2001 | Saleh et al. | |
| 6,312,569 | B1 | 11/2001 | Suzuki et al. | |
| 6,890,596 | B2 * | 5/2005 | Sarigiannis et al. | 427/248.1 |
| 6,951,813 | B2 * | 10/2005 | Derderian | 438/653 |
| 2004/0033310 | A1 * | 2/2004 | Sarigiannis et al. | 427/248.1 |
| 2004/0198025 | A1 * | 10/2004 | Derderian | 438/476 |
| 2005/0081882 | A1 * | 4/2005 | Greer et al. | 134/1.1 |
| 2005/0126585 | A1 * | 6/2005 | Sarigiannis et al. | 134/1.1 |

FOREIGN PATENT DOCUMENTS

WO WO 01/29893 A1 4/2001

* cited by examiner

*Primary Examiner*—Laura M. Schillinger
(74) *Attorney, Agent, or Firm*—TraskBritt

(57) ABSTRACT

A method of reducing the amount of halogenated materials in a halogen-containing environment. The method comprises introducing an aluminum compound into the halogen-containing environment, reacting the aluminum compound with the halogenated material to form a gaseous reaction product, and removing the gaseous reaction product from the environment. The aluminum compound may be a trialkylaluminum compound, an alane, an alkylaluminum hydride, an alkylaluminum halide, an alkylaluminum sesquihalide, or an aluminum sesquihalide. The aluminum compound may alternatively form a solid aluminum product, which is deposited on a surface associated with the halogen-containing environment or onto a semiconductor disposed therewithin. The halogenated material is incorporated into the solid aluminum product, forming an inert film within which the halogenated material is trapped.

11 Claims, 1 Drawing Sheet

METHOD OF REMOVING RESIDUAL CONTAMINANTS FROM AN ENVIRONMENT

BACKGROUND OF THE INVENTION

1. Field of the Invention

The present invention relates to a method of cleaning semiconductor production equipment. More specifically, the present invention relates to a method of reducing the presence of halogens or halogen-containing compounds in an environment used for semiconductor device fabrication such as a deposition chamber.

2. State of the Art

Semiconductor devices are fabricated by depositing multiple layers of material onto a surface of a substrate, such as a silicon wafer or other bulk semiconductor substrate. The material layers are deposited by various techniques, such as chemical vapor deposition (CVD) or physical vapor deposition (PVD), with each material layer being formed sequentially in a deposition chamber. Many of the techniques used to deposit the material layers produce impurities or contaminants that accumulate on walls or other surfaces of the deposition chamber. For instance, the impurities form on exposed surfaces on the interior of the deposition chamber. If the impurities subsequently dislodge or desorb from these surfaces when a material layer is being deposited, the impurities are incorporated into that material layer and may cause structural and compositional flaws in the semiconductor device that is being formed. The impurities affect the properties of the material layer and compromise its function in the semiconductor device. To limit the number of defective semiconductor devices that are produced, the surfaces of the deposition chamber must be periodically cleaned to remove the impurities before the chamber is again used for material layer deposition.

Wet cleaning processes have typically been used to remove the impurities by cleaning the interior of a deposition chamber with a liquid cleaning agent. However, these processes are time consuming and labor intensive. Dry cleaning processes, which utilize gaseous cleaning agents, have also been used to clean deposition chambers. The gaseous cleaning agents typically include halogen or halogen-containing compounds, such as nitrogen trifluoride ($NF_3$), sulfur hexafluoride ($SF_6$), tetrafluoroethylene ($C_2F_4$), chlorine, and chlorine trifluoride ($ClF_3$). For instance, $NF_3$ is commonly used to clean deposition chambers after tungsten or silicon oxide layers have been deposited. Chlorine is used to remove impurities remaining after the deposition of titanium or titanium nitride layers. The gaseous cleaning agents are introduced into a deposition chamber, where they react with the impurities to form volatile compounds that include the impurities. The volatilized impurities are then exhausted from the deposition chamber.

While the gaseous cleaning agents may be used effectively to remove the impurities from a deposition chamber, the gaseous cleaning agents themselves are difficult to remove because they are reactive and adsorb to the surfaces thereof. In other words, the gaseous cleaning agents remain in the "clean" deposition chamber after the cleaning process. Therefore, when additional material layers are formed on a semiconductor substrate disposed within the deposition chamber after the cleaning process, the halogen-containing compounds desorb from the surfaces and are incorporated into the material layers. Halogen-containing compounds are also produced by the reaction of the gaseous cleaning agents with post-deposition residue in the deposition chamber. For instance, in a deposition chamber in which oxides or nitrides of titanium have been deposited, residual titanium compounds react with chlorine- or fluorine-containing gaseous cleaning agents to produce chlorides and fluorides of titanium. These byproducts from the reaction of the gaseous cleaning agents and the post-deposition residue also become incorporated into the material layers.

These halogen-containing compounds affect the rate at which the material layer is deposited, raise the dielectric constant of the material layer, cause embrittlement of the material layer, and corrode or degrade exposed capacitor and contact structures. For instance, if fluorine is present in the deposition chamber, it is known to decrease the rate of atomic layer deposition (ALD) of silicon oxide from tris-tertbutylsilanol (TBOS). The halogen-containing compounds in the deposition chamber also raise the cost of the semiconductor devices by increasing the fabrication time needed to form a semiconductor device that meets performance quality and lifetime specifications. Therefore, reducing or eliminating the halogen-containing compounds remaining after conventional cleaning processes is of significance to the cost-effective fabrication of semiconductor devices that have high-quality performance and long performance life.

One technique of removing the halogen-containing compounds from the deposition chamber is to purge the deposition chamber with an inert gas or combination of inert gases. For instance, argon and nitrogen are commonly used to purge deposition chambers in which $NF_3$ cleaning has taken place. Long purge times are necessary to remove the halogen-containing compounds from the inside of the deposition chamber. However, these lengthy purge times do not effectively remove halogen-containing compounds that are adsorbed to the surfaces of the deposition chamber. To remove these adsorbed halogen-containing compounds, multiple depositions on "dummy" or "conditioning" wafers are performed until the halogen contamination has been reduced to an acceptable level. Oftentimes, as many as twenty dummy wafers are used before the halogen contamination has reached an acceptable level. Running the dummy wafers adds additional processing steps to the fabrication of the semiconductor devices, which reduces the number of semiconductor devices that is fabricated in a given time period, raises the costs of the semiconductor devices, and reduces profits realized by manufacturers.

BRIEF SUMMARY OF THE INVENTION

The present invention, in exemplary embodiments, relates to a method of reducing the concentration of halogenated materials in a halogen-containing environment. Such an environment may include, by way of example and not limitation, the interior volume and surfaces of a deposition chamber used for semiconductor device fabrication, as well as surfaces of components disposed in the chamber and surfaces and interior volumes of other components such as conduits, filters, pumps and traps used in association with a deposition chamber. The halogen-containing environment may, however, be present in any commercial, industrial or other setting.

One embodiment comprises a method including introducing at least one gaseous aluminum compound into the halogen-containing environment. The at least one gaseous aluminum compound may be a trialkylaluminum compound, an alane, an alkylaluminum hydride, an alkylaluminum halide, an alkylaluminum sesquihalide, or an aluminum sesquihalide. For instance, trimethyl aluminum (TMA), triethyl aluminum, triisobutyl aluminum, triethyl(tri-sec-butoxy)dialuminum (TETBOL), or tritertiarybutyl aluminum may be used as the at least one gaseous aluminum compound. The at least one gaseous aluminum compound is reacted with at least one halogenated material to form a gaseous reaction product, which is subsequently removed from the environment. The gaseous reaction product may be removed by venting the environment or applying a vacuum to the environment.

An additional embodiment of a method of reducing the concentration of halogenated materials in a halogen-containing environment is also provided. The method comprises introducing at least one gaseous aluminum compound and at least one oxidizer into the halogen-containing environment. The at least one gaseous aluminum compound may be a trialkylaluminum compound, an alane, an alkylaluminum hydride, an alkylaluminum halide, an alkylaluminum sesquihalide, or an aluminum sesquihalide, such as TMA, triethyl aluminum, triisobutyl aluminum, TETBOL, or tritertiarybutyl aluminum. The at least one oxidizer may be oxygen, ozone, water, hydrogen peroxide, or isopropanol. A solid aluminum product is then formed on at least a portion of at least one surface associated with the environment, for example, a deposition chamber enclosing the volume comprising the halogen-containing environment. The solid aluminum product may be a layer of aluminum oxide. An inert film comprising at least one halogenated material and the solid aluminum product is formed by incorporating the at least one halogenated material into the solid aluminum product. To form the inert film, an adduct may be formed between the solid aluminum product and the at least one halogenated material. A barrier layer may be formed over the inert film to prevent the release of the at least one halogenated material.

In yet another embodiment, the concentration of halogenated materials in a halogen-containing environment may also be reduced by introducing at least one gaseous aluminum compound and at least one oxidizer into the halogen-containing environment. A solid aluminum product is then formed on a surface of a semiconductor substrate present in the halogen-containing environment. At least one halogenated material is then incorporated into the solid aluminum product, forming an inert film. To prevent the release of the at least one halogenated material, a barrier layer may be formed over the inert film. At least one material layer may also be formed over the inert film.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawing in which:

DETAILED DESCRIPTION OF THE INVENTION

Figure 1:
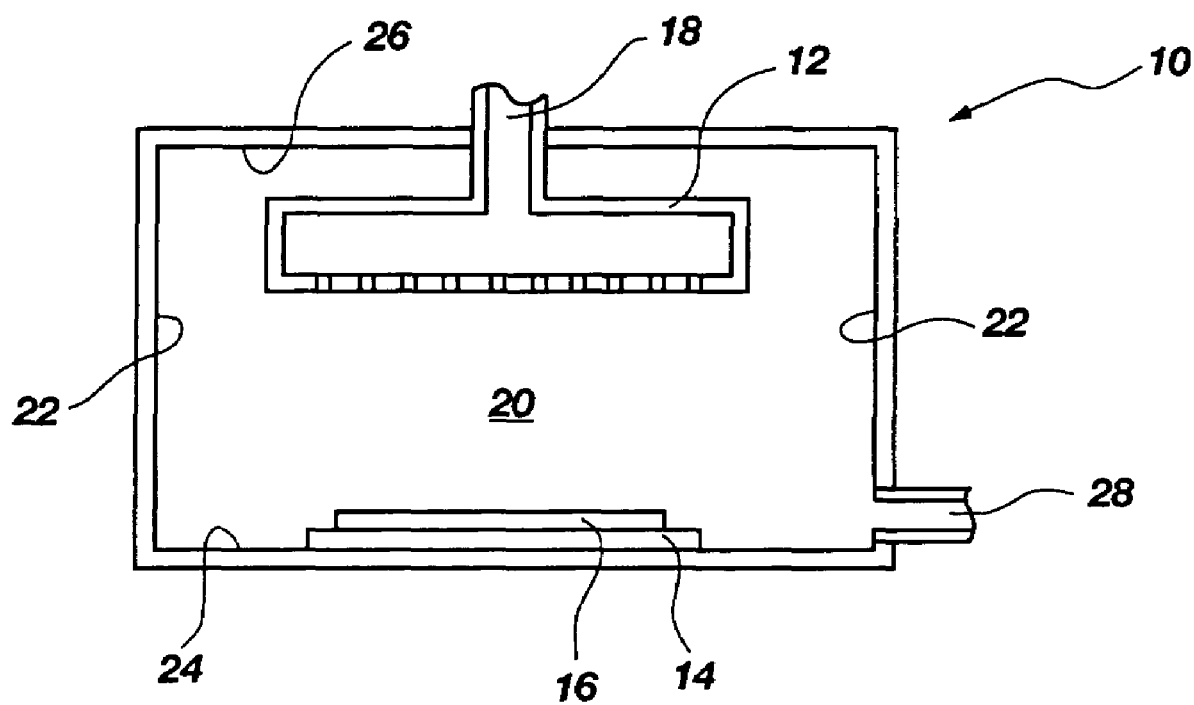
FIG. 1 is a schematic illustration of an exemplary deposition chamber having a semiconductor substrate disposed therewithin.

The presence of a halogenated material in a halogen-containing environment may be reduced or eliminated by introducing at least one aluminum compound into the halogen-containing environment. As used herein, the term "halogenated material" refers to a halogen or halogen-containing compound that may be used as a conventional cleaning agent, produced as a byproduct of a conventional cleaning process, or used as a reagent in a fabrication or other process in the semiconductor industry. Since halogenated materials are used in many processes in the semiconductor industry, the halogenated material may be a reagent that causes halogen contamination. For the sake of example only, the halogenated material may be $NF_3$, $SF_6$, $C_2F_4$, chlorine, or $ClF_3$. While these exemplary compounds include fluorine and/or chlorine, the aluminum compound may also be used to remove other halogen-containing compounds, such as those that contain bromine or iodine, from the halogen-containing environment.

The halogen-containing environment may be a space or volume having at least one halogenated material contained therewithin, or disposed on a surface associated therewith. The halogenated material may be present within the boundaries or borders of the halogen-containing volume or may also be a solid and may be adsorbed to surfaces, such as walls, associated with or enclosing the halogen-containing volume. For the sake of convenience only, the halogen-containing environment is described herein as an interior volume of a deposition chamber. Deposition chambers are known in the semiconductor art and are used to deposit material layers on a semiconductor substrate during fabrication of a plurality of semiconductor devices therefrom. The deposition chamber may be a conventional deposition chamber including, but not limited to, a CVD chamber or a PVD chamber. For the sake of example only, the deposition chamber may be used to deposit material layers formed from tungsten or silicon dioxide. However, the halogen-containing space may also include or have associated therewith other surfaces or spaces contaminated with halogenated materials, such as other processing or manufacturing equipment used in the semiconductor industry or other industries.

In order to facilitate a better understanding and appreciation for the nature of the problems addressed by the present invention and not by way of limitation thereof, FIG. 1 schematically depicts an exemplary deposition chamber 10 suitable for use in, for example, CVD processes. Deposition chamber 10 includes a showerhead 12 disposed over a heater stage 14 carrying a semiconductor substrate 16 such as, for the sake of discussion and not limitation of the invention, a silicon wafer. Input port 18 is used to introduce one or more precursor gases into the interior 20 of deposition chamber 10 through showerhead 12. Semiconductor substrate 16 may be maintained at a desired, elevated temperature by heater stage 14, which is selectively variable in heat output. The one or more precursor gases flowing into the interior 20 of deposition chamber 10 include a material component or combination of components to be deposited as a film on semiconductor substrate 16. However, because the deposition process is nonspecific to semiconductor substrate 16, a film of the material component or combination is also undesirably deposited on heater stage 14 as well as on side walls 22, bottom wall 24 and top wall 26 and other surfaces present within the interior 20 of deposition chamber 10. Outlet port 28, used to exhaust gases from the interior 20 of deposition chamber 10, may also have its interior undesirably coated with a film of the component or combination. As noted previously, when a deposition chamber such as deposition chamber 10 is cleaned using conventional techniques to remove the component or combination, a halogenated environment may result and halogenated compounds are undesirably formed on the interior surfaces of deposition chamber 10 and associated equipment.

The aluminum compound may be a liquid or a gas, depending on temperature and/or pressure conditions present in the interior 20 of deposition chamber 10. Desirably, the aluminum compound is introduced into the interior 20 of deposition chamber 10 through, for example, input port 18 and showerhead 12 in a gaseous or vapor state, the former term as used herein including the latter, so that it fully penetrates the deposition chamber 10 and contacts the halogenated materials, such as those adsorbed to the interior surfaces of the deposition chamber 10 on sidewalls 22, bottom wall 24 and top wall 26. However, the aluminum compound may also be introduced into the deposition chamber as a liquid, such as by using jets or atomizers (not shown). The liquid aluminum compound may then be converted into a gaseous state in deposition chamber 10 by maintaining the interior 20 of deposition chamber 10 at conditions sufficient to gasify the aluminum compound.

The aluminum compound may be an organic aluminum compound, such as an alkyl aluminum compound. The alkyl aluminum compound may include, but is not limited to, a trialkylaluminum compound, an alane, an alkylaluminum hydride, an alkylaluminum halide, an alkylaluminum sesquihalide, an aluminum sesquihalide, and mixtures thereof. Examples of trialkylaluminum compounds include, but are not limited to, trimethyl aluminum (TMA), triethyl aluminum, triisobutyl aluminum, and tritertiarybutyl aluminum. Examples of alane compounds include, but are not limited to, dimethylethylamine alane and trimethylamine alane. Examples of alkylaluminum hydrides include, but are not limited to, dimethyl aluminum hydride, diethyl aluminum hydride, and methyl ethyl aluminum hydride. Dichloroethyl aluminum or chlorodiethyl aluminum are commonly available alkylaluminum halides that may be used. In addition to aluminum compounds, compounds of other Group III elements, such as boron compounds, gallium compounds, indium compounds, or thallium compounds, may be used as long as the compounds form stable metal oxides.

To reduce the amount of the halogenated material in a deposition chamber, the aluminum compound may be introduced into the deposition chamber. For instance, the aluminum compound may be flowed into the deposition chamber in a constant stream or may be pulsed into the deposition chamber. The aluminum compound may contact and react with the halogenated material to form a gaseous reaction product, such as an aluminum halide compound. The reaction product may have an increased number of halogen atoms per aluminum atom compared to the aluminum compound. The gaseous reaction product is subsequently removed from the deposition chamber, such as by venting the deposition chamber or applying a vacuum to the deposition chamber. The aluminum compound may be introduced into the deposition chamber after a conventional cleaning process that utilizes a halogenated material has been performed on the deposition chamber. By repeatedly introducing the aluminum compound into the deposition chamber and removing the gaseous reaction products, the presence of halogenated material in the deposition chamber may be reduced or eliminated. A dummy wafer may be used to protect sensitive portions of the deposition chamber, such as a surface of a heater chuck, when the gaseous aluminum compound is present in the deposition chamber.

The aluminum compound may be present in the deposition chamber in an amount sufficient to react with the halogenated material. The amount of the aluminum compound needed in the deposition chamber may depend on the aluminum compound that is used and the halogenated material to be removed. To achieve the desired amount of the aluminum compound, the aluminum compound may be pulsed or introduced into the deposition chamber for a sufficient amount of time. For instance, the aluminum compound may be pulsed into the deposition chamber for a time ranging from approximately 1 second to approximately 10 seconds. The temperature and pressure conditions at which the aluminum compound is introduced into the deposition chamber are not critical to the operability of the present invention. For instance, the aluminum compound may be introduced into the deposition chamber at a temperature and pressure that is suitable for reacting the aluminum compound with the halogenated material. When the deposition chamber is to be cleaned, the deposition chamber may be maintained at a temperature ranging from approximately 150° C. to approximately 400° C. so that the aluminum compound is present in the deposition chamber at that temperature range. The deposition chamber may be maintained at a pressure ranging from approximately 100 mtorr to approximately 100 torr, such as from approximately 100 mtorr to approximately 10 torr. Desirably, the temperature and pressure conditions used to react the aluminum compound with the halogenated material are similar to the temperature and pressure conditions under which the material layers are formed in the deposition chamber. Therefore, the temperature and pressure conditions of the deposition chamber do not need to be reconfigured before cleaning.

Since the aluminum compound removes the halogenated materials from the deposition chamber, the method of the present invention may be used, in combination with a conventional cleaning process, to thoroughly clean the deposition chamber of halogenated materials.

In one embodiment, the gaseous aluminum compound may be a trialkylaluminum compound, such as TMA or triethylaluminum.

Alternatively, the aluminum compound may be used to form a solid aluminum product on at least a portion of at least one surface of the deposition chamber. The halogenated materials present in the deposition chamber may be incorporated into the solid aluminum product, forming an inert film in the deposition chamber. In other words, as the solid aluminum product is deposited on one or more surfaces of the deposition chamber, at least a portion of the halogenated materials present in the deposition chamber may be incorporated into the solid aluminum product. The solid aluminum product and the halogenated material may form an adduct, trapping the halogenated material in the solid aluminum product so that it is no longer available to contaminate semiconductor devices fabricated in the deposition chamber. The solid aluminum product having the halogenated materials is substantially inert and, therefore, does not react with the components of the material layers. The inert film may also be more stable than the gaseous reaction product formed by the reaction of the aluminum compound and the halogenated material, which was described previously. Therefore, the inert film may remain in the deposition chamber during subsequent depositions of the material layers of the semiconductor device being fabricated.

The solid aluminum product may be formed by introducing the aluminum compound into the deposition chamber in the presence of an oxidizer. The aluminum compound is oxidized by the oxidizer to aluminum oxide ($Al_2O_3$) or another oxidized form of aluminum, which deposits on the surface of the deposition chamber. $Al_2O_3$ is a stable ceramic material and is sufficiently inert to ensure that little or no halogenated materials leak from this inert film during subsequent use of the deposition chamber. Since many aluminum compounds readily form monolayers on different types of surfaces, the solid aluminum product may be formed by an ALD-type process, such as by sequentially introducing the aluminum compound and the oxidizer to produce a monolayer of $Al_2O_3$. For instance, the aluminum compound may be introduced into the deposition chamber and the temperature and/or pressure conditions maintained so that a monolayer of the aluminum compound is formed on at least a portion of the surfaces of the deposition chamber. The oxidizer may then be introduced and the conditions maintained so that the $Al_2O_3$ layer is formed on at least a portion of the surfaces. The temperature and pressure conditions necessary to deposit the $Al_2O_3$ layer may be higher than the temperature and pressure conditions necessary to react the aluminum compound with the halogenated material. For instance, the temperature may be from approximately 300° C. to approximately 400° C., while the pressure is from approximately 500 mtorr to approximately 10 torr.

The oxidizer may be introduced into the deposition chamber after the aluminum monolayer has been deposited to avoid appreciable gas phase reactions that may negatively affect the quality of the step coverage of the $Al_2O_3$ layer. An ALD-type process is desirable because ALD may be used to completely cover the deposition chamber with the $Al_2O_3$ layer. ALD may also provide even step coverage of the $Al_2O_3$ layer and is capable of incorporating the halogen material into the $Al_2O_3$ layer. Even step coverage may be desirable so that the aluminum oxide is capable of being formed on areas of the deposition chamber that may not be attainable by other deposition techniques, such as CVD. In addition, if the solid aluminum product is formed by ALD, it has a minimal thickness but yet is still capable of incorporating a high percentage of the halogenated materials into the inert film. Depositing the solid aluminum layer by ALD is particularly desirable in cases in which an even deposition of the solid aluminum product is needed. ALD processes are known in the art and, therefore, are not described in detail herein. In addition, other conventional techniques of depositing aluminum oxide may be used. For example, sequential flow techniques, such as CVD, may be used to provide a substantially continuous deposition of $Al_2O_3$ without the need to implement a gas purge. The $Al_2O_3$ layer deposited by CVD may also thicken at a greater speed than with ALD.

The aluminum compound may be introduced into the deposition chamber as either a liquid or a gas. If the aluminum compound is a liquid, it may be vaporized, such as by a vaporizer, before it is introduced into the deposition chamber. Desirably, the aluminum compound is gaseous at the temperatures and pressure conditions in the deposition chamber so that it may penetrate and contact the halogenated material. The aluminum compounds previously described may be used to form the solid aluminum product as long as the aluminum compound, in an oxidized state, is capable of forming an adduct with the halogenated material. The aluminum compound may also have a high vapor pressure at the temperatures required for its deposition and be thermally stable at these temperatures. For the sake of example only, the aluminum compound may have a vapor pressure ranging from approximately 8.7 torr to approximately 15.2 torr. The aluminum compound may be present in the deposition chamber in an amount sufficient to form the adduct with the halogenated material. The amount of the aluminum compound may depend on the halogenated material that is to be removed from the deposition chamber, the surface area of the deposition chamber, and the reactivity of the aluminum compound.

The oxidizer may be a gaseous compound that reacts with the aluminum compound to form aluminum oxide. The oxidizer may also be plasma assisted. The oxidizer may include, but is not limited to, oxygen ($O_2$), ozone ($O_3$), water ($H_2O$), hydrogen peroxide ($H_2O_2$), and alcohols, such as isopropanol. The oxidizer may be selected depending on the aluminum compound to be oxidized. For instance, $O_3$ and/or $H_2O$ are known to oxidize most aluminum compounds. However, while $O_2$ also oxidizes many aluminum compounds, it does not effectively oxidize TMA. The oxidizer may be present in the deposition chamber in an amount sufficient to oxidize the aluminum compound. The amount of oxidizer may depend on the temperature at which the deposition chamber is maintained and the reactivity of the oxidizer.

During cleaning, the deposition chamber may be maintained at temperature and/or pressure conditions that are sufficient to form the solid aluminum product on at least one surface of the deposition chamber. For instance, the deposition chamber may be maintained at a temperature ranging from approximately 150° C. to approximately 500° C.

Additional deposits of the inert film may be performed, as necessary, to reduce the halogen contamination in the deposition chamber. For instance, the aluminum compound may be introduced into the deposition chamber as a series of regularly timed concentration pulses. Each pulse of the aluminum compound may be followed by a pulse of the oxidizer. The aluminum compound and the oxidizer react to form the solid aluminum product, into which the halogenated materials may be incorporated. A short gas purge may be performed after the oxidation reaction is complete in order to prevent gas phase reactions during subsequent ALD cycles.

After multiple deposits of the inert film, this layer may become sufficiently thick to affect use of the deposition chamber. For instance, the inert film may affect the function of components of the deposition chamber, such as heaters. Therefore, the inert film may be removed from the deposition chamber by subjecting the deposition chamber to a conventional wet cleaning process. Etchants used to remove the inert film may include, but are not limited to, hydrogen peroxide or ammonium hydroxide. If the inert film is formed from $Al_2O_3$, removing the inert film is a lengthy process because $Al_2O_3$ etches at a slow rate.

While the inert film traps the halogenated material, the halogenated materials may eventually be released over time. To further reduce or eliminate the release of the halogenated material, a barrier layer, such as a silicon oxide layer, may be formed over at least a portion of the inert film. In other words, the barrier layer prevents the release of the halogenated materials. The silicon oxide layer may be formed by conventional techniques, such as by ALD. For the sake of example only, a silicon precursor may be introduced into the deposition chamber, followed by the oxidizer. The silicon precursor may include, but is not limited to, silane, TBOS, or tetraethyloxysilane (TEOS). The silicon precursor may react with the oxidizer in the deposition chamber to form the silicon oxide layer. Desirably, the silicon precursor may react under conditions that are also conducive to forming the $Al_2O_3$ layer. For instance, the conditions in the deposition chamber are maintained so that the silicon oxide layer and the $Al_2O_3$ layer may be deposited without adjusting the conditions. Triethyl(tri-sec-butoxy)dialuminum (TETBOL) may be used as the silicon precursor and as the aluminum compound. If the oxidizer is introduced into the deposition chamber with the TETBOL and conditions in the deposition chamber are appropriately maintained, a deposit that includes aluminum oxide and silicon oxide may be formed. The ratio of aluminum oxide to silicon oxide formed at a particular time for a particular concentration of TETBOL may depend on the ratio of the concentration of TETBOL to the oxidizer.

Desirably, TBOS is used as the silicon precursor because it reacts to produce an oxidizer of the aluminum compound, in addition to depositing a silicon monolayer. Therefore, the aluminum compound may be oxidized, which catalyzes the formation of the silicon oxide layer. In addition, the deposition of silicon oxide from certain silicon precursors may be catalyzed by alkylaluminum compounds. For the sake of example only, the deposition of silicon oxide from TBOS is catalyzed by a wide variety of alkylaluminum compounds. Since the aluminum compound catalyzes the deposition of silicon oxide, the ratio of silicon oxide and aluminum oxide being formed at a particular time may be varied by altering the stoichiometric ratio of TBOS to the aluminum compound that is present in the deposition chamber at a particular time. The silicon precursor may be paired with an aluminum compound that provides the most efficient catalysis. In one embodiment, TBOS is used as the silicon precursor and TMA is used as the aluminum compound.

In addition to preventing the release of the halogenated materials, the barrier layer may also increase the etch rate of the inert film. In other words, by depositing the barrier layer over the inert film, the etch rate of the combined barrier layer and inert film is increased. Therefore, the combined barrier layer and inert film may be removed from the deposition chamber by a conventional wet cleaning process that is substantially shorter than the cleaning process necessary to remove the inert film alone. The combined barrier layer and inert film may be removed from the deposition chamber using conventional etchants including, but not limited to, $ClF_3$. The combined barrier layer and inert film are also substantially inert. As such, when the combined barrier layer and inert film are exposed to conditions that are used to deposit many material layers, the halogen materials may not be readily released into the deposition chamber.

It is also contemplated that the inert film may be deposited on a semiconductor substrate that is contaminated with the halogenated materials. For instance, chlorine contamination of the semiconductor substrate may be common during a dry etch process. The inert film may be deposited as a layer on the semiconductor substrate, using the techniques previously described. Since the halogenated materials become incorporated into the inert film, the halogenated materials may be present on the semiconductor substrate without affecting the operability of the semiconductor devices formed therefrom. Depending on the type of semiconductor device that is ultimately to be formed from the semiconductor substrate, the inert film may remain on the semiconductor device or may be removed before the semiconductor device is subjected to further integration processes. Material layers of the semiconductor device may then be formed over the inert film. The barrier layer, as previously described, may also be formed over the inert film to prevent the release of the halogenated materials from the inert film.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A method of removing halogenated materials from a halogen-containing environment, comprising:
   introducing at least one gaseous aluminum compound selected from the group consisting of an alane, an alkylaluminum hydride, an alkylaluminum halide, an alkylaluminum sesquihalide, and an aluminum sesquihalide into a halogen-containing environment;
   reacting the at least one gaseous aluminum compound with at least one halogenated material to form a gaseous reaction product; and
   removing at least a portion of the gaseous reaction product from the environment.

2. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing the at least one gaseous aluminum compound into an environment having at least one halogenated material adhered to at least one surface associated therewith.

3. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing the at least one gaseous aluminum compound into an environment having the at least one halogenated material contained therewithin.

4. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises pulsing the at least one gaseous aluminum compound into the halogen-containing environment.

5. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing the at least one gaseous aluminum compound into the halogen-containing environment in an amount sufficient to react with the at least one halogenated material.

6. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing dimethylethylamine alane or trimethylamine alane into the halogen-containing environment.

7. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing at least one organic aluminum compound selected from the group consisting of dimethyl aluminum hydride, diethyl aluminum hydride, and methyl ethyl aluminum hydride into the halogen-containing environment.

8. The method of claim 1, wherein introducing at least one gaseous aluminum compound selected from the group consisting of an alane, an alkylaluminum hydride, an alkylaluminum halide, an alkylaluminum sesquihalide, and an aluminum sesquihalide into a halogen-containing environment comprises introducing the at least one gaseous aluminum compound into a deposition chamber contaminated with the at least one halogenated material.

9. The method of claim 1, wherein reacting the at least one gaseous aluminum compound with at least one halogenated material to form a gaseous reaction product comprises reacting the at least one gaseous aluminum compound with the at least one halogenated material to form an aluminum halide compound.

10. The method of claim 1, wherein reacting the at least one gaseous aluminum compound with at least one halogenated material comprises reacting the at least one gaseous aluminum compound with at least one of $NF_3$, $SF_6$, $C_2F_4$, chlorine, and $ClF_3$.

11. The method of claim 1, wherein removing at least a portion of the gaseous reaction product from the environment comprises venting the environment or applying a vacuum to the environment.

* * * * *